United States Patent
Park et al.

(10) Patent No.: US 10,033,845 B2
(45) Date of Patent: Jul. 24, 2018

(54) CONTACT STRUCTURE AND CONTACT DEVICE, AND ELECTRONIC DEVICE INCLUDING THE SAME

(71) Applicant: Samsung Electronics Co., Ltd., Gyeonggi-do (KR)

(72) Inventors: Jeong Seok Park, Gyeonggi-do (KR); Jong Chul Choi, Gyeonggi-do (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/231,897

(22) Filed: Aug. 9, 2016

(65) Prior Publication Data
US 2017/0055353 A1    Feb. 23, 2017

(30) Foreign Application Priority Data
Aug. 21, 2015  (KR) .................. 10-2015-0117710

(51) Int. Cl.
| | |
|---|---|
| *H01H 5/18* | (2006.01) |
| *H01H 1/10* | (2006.01) |
| *H04M 1/02* | (2006.01) |
| *H05K 1/02* | (2006.01) |

(52) U.S. Cl.
CPC ........ *H04M 1/0277* (2013.01); *H05K 1/0215* (2013.01); *H04M 1/0274* (2013.01)

(58) Field of Classification Search
CPC ... H01R 12/55; H01R 13/2478; H05K 1/0215
USPC .................................. 200/406, 513
See application file for complete search history.

(56) References Cited

U.S. PATENT DOCUMENTS

| | | | |
|---|---|---|---|
| 4,778,952 A * | 10/1988 | Watkins ................. | H01H 13/70 200/292 |
| 4,933,522 A * | 6/1990 | Celander ............ | H01H 13/7006 200/513 |
| 4,978,818 A * | 12/1990 | Rothlin .................. | H01H 13/48 200/406 |
| 6,501,036 B2 * | 12/2002 | Rochon .............. | H01H 13/7006 200/302.2 |
| 6,646,217 B2 * | 11/2003 | Omata .................... | H01H 5/30 200/406 |
| 8,080,743 B2 * | 12/2011 | Wang ................... | H01H 25/041 200/5 E |
| 8,784,146 B2 | 7/2014 | Yang et al. | |

(Continued)

FOREIGN PATENT DOCUMENTS

| | | |
|---|---|---|
| KR | 10-2011-0117892 A | 10/2011 |
| KR | 10-2013-0026735 A | 3/2013 |

*Primary Examiner* — Sherman Ng
(74) *Attorney, Agent, or Firm* — Cha & Reiter, LLC

(57) ABSTRACT

An electronic device may include a housing a housing comprising a first surface and an second surface generally parallel to the first surface, the second surface including an opening extending to the first surface, the first and second surface being spaced apart from one another along an axis; a first conductive member being coupled to the first surface; a second conductive member spaced apart substantially from the first conductive member along the axis; and a conductive dome structure disposed between at least a part of the first conductive member and at least a part of the second conductive member and forming an electric path between the first conductive member and the second conductive member.

12 Claims, 14 Drawing Sheets

(56) References Cited

U.S. PATENT DOCUMENTS

| | | |
|---|---|---|
| 8,803,016 B2 | 8/2014 | Kang |
| 2002/0096425 A1* | 7/2002 | Yamagata ................ H01H 5/30 200/406 |
| 2003/0221943 A1* | 12/2003 | Masuda ................ H01H 13/48 200/406 |
| 2009/0183977 A1* | 7/2009 | Chang .................... H01H 1/10 200/513 |
| 2010/0012473 A1* | 1/2010 | Zieder .................... H01H 13/48 200/341 |
| 2010/0224474 A1* | 9/2010 | Jeffery ................ H01H 13/704 200/512 |
| 2011/0079499 A1 | 4/2011 | Kang et al. |
| 2011/0297524 A1* | 12/2011 | Low ....................... H01H 13/80 200/512 |
| 2012/0080301 A1* | 4/2012 | Alvarez ................ H01H 13/82 200/513 |
| 2013/0059486 A1 | 3/2013 | Yang et al. |
| 2014/0302730 A1 | 10/2014 | Yang et al. |

* cited by examiner

CONTACT STRUCTURE AND CONTACT DEVICE, AND ELECTRONIC DEVICE INCLUDING THE SAME

CLAIM OF PRIORITY

This application claims the benefit under 35 U.S.C. § 119(a) of a Korean patent application filed on Aug. 21, 2015 in the Korean Intellectual Property Office and assigned Serial number 10-2015-0117710, the entire disclosure of which is hereby incorporated by reference.

TECHNICAL FIELD

The present disclosure generally relates to an electronic device, and more particularly relates to a contact structure for grounding an electrical device.

BACKGROUND

Electronic devices perform various functions including, for example, communication. Electronic devices require electricity or power to operate. Therefore, the electronic devices typically require at least one built-in structure so that they can be grounded. To this end, a ground structure is typically supported using, for example, a conductive tape, a conductive sponge, or a clip structure in the electronic devices.

When using a conductive tape, since the conductive tape is attached in a state in which a lot of segmental sections are provided to a printed circuit board, stable grounding may not be obtained due to resin overflow in the segmental sections, causing a performance deviation.

When using a conductive sponge, since a Z-axis (that is along the vertical direction) compression ratio (e.g., 30-40%) for device coupling should be considered, a large-thickness mounting space is required. A conductive sponge is vulnerable to oxidation corrosion, temperature variation, etc., and may be permanently deformed if it is compressed for a long period of time. As described above, in the case of using a conductive sponge or a conductive tape, stable grounding may not be achieved, and a large space for mounting a component may be required if an additional contact component is used, thereby making it difficult to make a slim product.

SUMMARY

Accordingly, an aspect of the present disclosure is to provide a contact structure and a contact device (or a contact mechanism) which provides a stable ground and enable slim mounting and an electronic device including the same.

In accordance with an aspect of the present disclosure, an electronic device may include a housing a housing having a first surface and an second surface substantially parallel to the first surface, the second surface including an opening extending to the first surface, the first and second surface being spaced apart from one another along an axis; a first conductive member being coupled to the first surface; a second conductive member spaced apart substantially from the first conductive member along the axis; and a conductive dome structure disposed between at least a part of the first conductive member and at least a part of the second conductive member and forming an electric path between the first conductive member and the second conductive member.

In accordance with a further aspect of the present disclosure, a contact structure for an electric connection of a mobile electronic device having a printed circuit board (PCB) having a conductive pattern formed on the PCB, the contact structure may include: a plate-type central body having a center part which is raised higher than a peripheral part, the central body curved with a certain curvature from the peripheral part to the center part; and at least one lead extending outwards from an edge of the central body. The lead may be disposed so as to electrically contact the conductive pattern formed on the PCB.

In accordance with another aspect of the present disclosure, a contact device for an electric connection of a mobile electronic device having a printed circuit board (PCB). The contact device may include: a contact structure comprising a plate-type central body having a center part which is raised higher than a peripheral part, the central body curved with a certain curvature from the peripheral part to the center part, and at least one lead extending outwards from an edge of the central body; and a fixing part which exposes at least a part of the central body while surrounding the lead or the lead and at least a part of the edge of the central body, wherein an adhesive layer is disposed on a surface of the fixing part, the adhesive part surrounding the lead or the lead and at least a part of the edge of the central body.

In accordance with a further aspect of the present disclosure, a mobile electronic device may include: a contact device having a contact structure including a plate-type central body having a center part; a peripheral part, the center part being raised higher than a peripheral part, the central body curved with a certain curvature from the peripheral part to the center part; at least one lead extending outwards from an edge of the central body; a fixing part which exposes at least a part of the central body while surrounding at least one of the lead and at least a part of the edge of the central body, an adhesive layer being disposed on a surface of the fixing part, the adhesive layer surrounding at least one of the lead and at least a part of the edge of the central body; and a printed circuit board (PCB) to which the fixing part is bonded and which electrically contacts the contact structure.

These and other aspects of the present disclosure are more fully described hereinbelow.

DETAILED DESCRIPTION

Figure 1A:
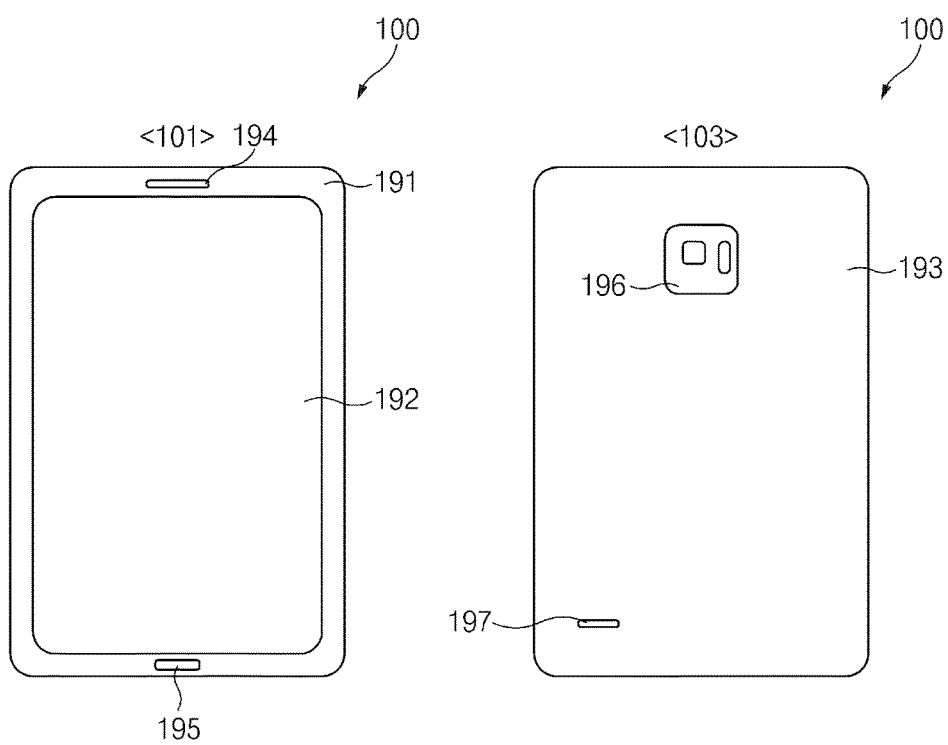
FIG. 1A depict front and back views of an electronic device according to an embodiment of the present disclosure.

Hereinafter, various embodiments of the present disclosure will be described in detail with reference to the accompanying drawings. However, it should be understood that the present disclosure is not limited to specific embodiments, but rather includes various modifications, equivalents and/or alternatives of the embodiments of the present disclosure. Regarding description of the drawings, like reference numerals may refer to like elements.

The term "have", "may have", "include", "may include", "comprise", or the like used herein indicates the existence of a corresponding feature (e.g., a number, a function, an operation, or an element) and does not exclude the existence of an additional feature.

The term "A or B", "at least one of A and/or B", or "one or more of A and/or B" may include all possible combinations of items listed together. For example, the term "A or B", "at least one of A and B", or "at least one of A or B" may indicate all the cases of (1) including at least one A; (2) including at least one B; and (3) including at least one A and at least one B.

The term "first", "second", or the like used herein may modify various elements regardless of the order and/or priority thereof, and is used only for distinguishing one element from another element, without limiting the elements. For example, "a first user device" and "a second user device" may indicate different user devices regardless of the order or priority. For example, without departing from the scope of the present disclosure, a first element may be referred to as a second element and vice versa.

It will be understood that when a certain element (e.g., a first element) is referred to as being "operatively or communicatively coupled with/to" or "connected to" another element (e.g., a second element), the certain element may be coupled to the other element directly or via another element (e.g., a third element). However, when a certain element (e.g., a first element) is referred to as being "directly coupled" or "directly connected" to another element (e.g., a second element), there may be no intervening element (e.g., a third element) between the element and the other element.

The term "configured (or set) to" used herein may be interchangeably used with the term, for example, "suitable for", "having the capacity to", "designed to", "adapted to", "made to", or "capable of". The term "configured (or set) to" may not necessarily have the meaning of "specifically designed to". In some cases, the term "device configured to" may indicate that the device "may perform" together with other devices or components. For example, the term "processor configured (or set) to perform A, B, and C" may represent a dedicated processor (e.g., an embedded processor) for performing a corresponding operation, or a generic-purpose processor (e.g., a CPU or an application processor) for executing at least one software program stored in a memory device to perform a corresponding operation.

The terminology used herein is only used for describing specific embodiments and is not intended to limit the scope of other embodiments. The terms of a singular form may include plural forms unless otherwise specified. The terms used herein, including technical or scientific terms, have the same meanings as understood by those skilled in the art. Terms defined in general dictionaries, among the terms used herein, may be interpreted as having meanings that are the same as or similar to contextual meanings defined in the related art, and should not be interpreted in an idealized or overly formal sense unless otherwise defined explicitly. Depending on cases, even the terms defined herein should not be such interpreted as to exclude various embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. According to various embodiments of the present disclosure, the wearable device may include at least one of an accessory-type device (e.g., a watch, a ring, a bracelet, an anklet, a necklace, glasses, a contact lens, a head-mounted device (HDM)), a textile- or clothing-integrated-type device (e.g., an electronic apparel), a body-attached-type device (e.g., a skin pad or a tattoo), and/or a bio-implantable-type device (e.g., an implantable circuit).

In some various embodiments of the present disclosure, an electronic device may be a home appliance. The home appliance may include at least one of, for example, a television (TV), a digital versatile disc (DVD) player, an audio, a refrigerator, an air conditioner, a cleaner, an oven, a microwave oven, a washing machine, an air cleaner, a set-top box, a home automation control panel, a security control panel, a TV box (e.g., Samsung HomeSync™, Apple TV™, or Google TV™, a game console (e.g., Xbox™ or PlayStation™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller's machine (ATM), a point of sales (POS) of a store, or an Internet of things device (e.g., a bulb, various sensors, an electric or gas meter, a sprinkler, a fire alarm, a thermostat, a streetlamp, a toaster, exercise equipment, a hot water tank, a heater, a boiler, and/or the like).

According to some various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). In various embodiments of the present disclosure, an electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of technology.

Hereinafter, an electronic device according to various embodiments of the present disclosure will be described with reference to the accompanying drawings. The term "user" used herein may refer to a person who uses an electronic device or may refer to a device (e.g., an artificial electronic device) that uses an electronic device.

FIG. 1A is a diagram illustrating an example of an electronic device according to an embodiment of the present disclosure.

Referring to FIG. 1A, as shown in a frontal state 101, an electronic device 100 may include a display 192 disposed on a front of the electronic device 101 and a case (or housing) 191 surrounding at least a part (e.g., at least a part of an edge) of the display 192. According to various embodiments of the present disclosure, the electronic device 100 may further include a receiver 194 disposed on one side (e.g., upper side) of the case 191 and a home button 195. Furthermore, as shown in a state 103, the electronic device 100 may include a cover 193, a camera module 196, and a speaker hole 197 arranged at a rear of the electronic device 100. A part of the electronic device described below may include, for example, at least a part of an area where a printed circuit board (PCB) disposed inside the case 191 contacts a bracket 120 (FIG. 1B) or at least a part of an area where the PCB contacts at least a part of the display 192 or a metal substrate (e.g., a heat dissipating plate or a grounding plate) disposed at a lower end of the display 192.

Figure 1B:
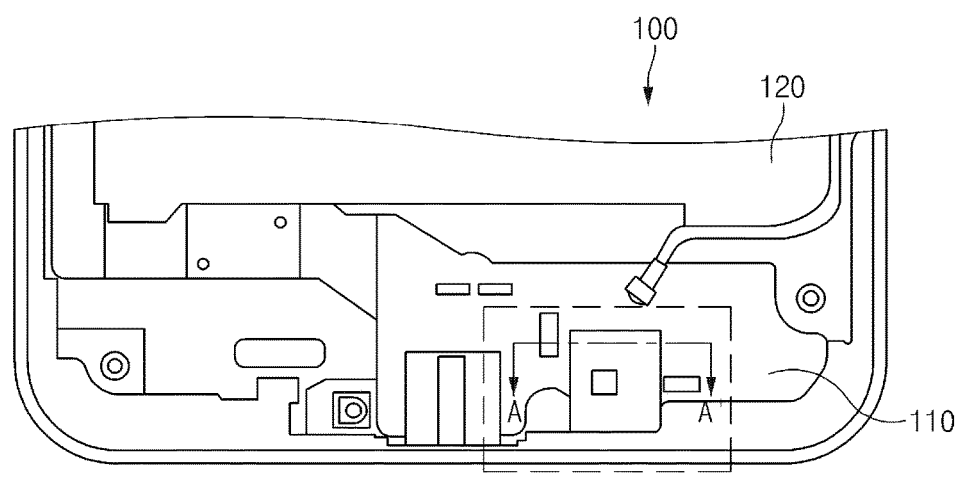
FIG. 1B is a diagram illustrating a part of an electronic device with parts removed according to an embodiment of the present disclosure.

FIG. 1B is a diagram illustrating a part of an electronic device according to an embodiment of the present disclosure.

Referring to FIG. 1B, the electronic device 100 may include, for example, the bracket 120 and a PCB 110. The electronic device 100 may further include a display, an external protective layer (e.g., glass), a cover (e.g., a rear cover, a battery cover, or the like), a battery, etc.

According to various embodiments of the present disclosure, at least a part of the bracket 120 may be formed of a metal material (e.g., a conductive metal material such as, for example, aluminum, iron, copper, stainless steel (SUS), etc.). For example, the entirety of the bracket 120 may be formed of a metal material. Alternatively, at least a part of the bracket 120, which is adjacent to an area where the PCB 110 is disposed may be formed of a metal material. A part of the bracket 120 may include a first placing area in which a battery may be placed and a second placing area in which the PCB 110 may be placed adjacent to the area in which the battery is disposed.

According to various embodiments of the present disclosure, at least one physical element required for operating the electronic device 100 may be disposed on the PCB 110. The PCB 110 may include a part of an entire PCB required for operating the electronic device 100. According to an embodiment of the present disclosure, at least a part of the PCB 110 may include a connector PCB (e.g., a USB PCB) related to a connector or an antenna PCB related to an antenna. At least a part of a surface of the PCB 110 may be formed of a nonconductive material or an insulating material. Various signal wirings may be arranged in the PCB 110. For example, according to an embodiment of the present disclosure, an open part (or exposed part) on which a conductive pattern (e.g., a grounding terminal, an antenna connection terminal, or the like) is disposed may be disposed on at least one of a front surface of the PCB 110 (e.g., an opposite surface to a surface facing the bracket 120) or a rear surface of the PCB 110 (e.g., a surface facing the bracket 120). A contact structure may be disposed on the open part so that the conductive pattern may electrically contact the contact structure. According to an embodiment of the present disclosure, the open part may be disposed on the rear surface of the PCB 110, and the contact structure may be disposed so as to be aligned with the open part, and may electrically contact the bracket 120. The PCB 110 may be fixed to the bracket 120 using a joining tool (e.g., a screw, a hook module, etc.).

As described above, the electronic device 100 according to an embodiment of the present disclosure, may include an open part that may be formed by removing an insulating layer of a certain contact area (e.g., a grounding terminal, an antenna connection terminal, etc.) of the PCB 110 between facing surfaces of the metallic bracket 120 and the PCB 110, and a dome-type contact structure may be disposed on the open part so that an electric contact between the bracket 120 and the contact area may be provided. As the insulating layer is removed, the open part of the PCB 110 may expose a metal area provided to the PCB 110. Therefore, the electronic device 100 may provide a stable contact state between a specific contact area of the PCB 110 and the bracket 120 using the dome-type contact structure even if a space between the bracket 120 and the PCB 110 is narrow such that the bracket 120 and the PCB 110 are in close proximity with one another (e.g., 1 mm or less or 0.7 mm or less).

Figure 2:
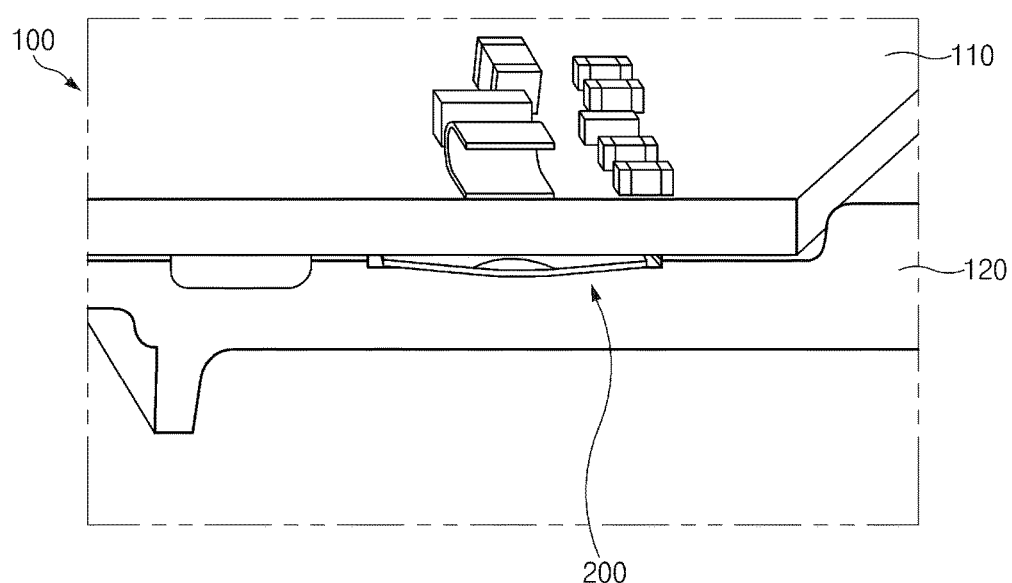
FIG. 2 is a diagram illustrating a cross section of an electronic device taken along line A-A' of FIG. 1B according to an embodiment of the present disclosure.

FIG. 2 is a diagram illustrating a cross section of an electronic device taken along line A-A' according to an embodiment of the present disclosure.

Referring to FIG. 2, in the electronic device 100 according to an embodiment of the present disclosure, the PCB 110 may be disposed on the bracket 120. At least one physical element may be disposed on one surface of the PCB 110. According to an embodiment of the present disclosure, a contact device 200 (or contact apparatus, or contact mechanism, or contact plate) may be disposed on one surface of the PCB 110. For example, the contact device 200 may be disposed on one surface of the PCB 110, which faces the bracket 120. The contact device 200 may include a supported area, which contacts the PCB 110 and a protrusion area protruding to a certain height from the surface of the PCB 110. The contact device 200 may be formed of a metal material which is electrically conductive. The contact device 200 may have such a structure that an elastic force is generated against a pressure applied towards the PCB 110 from an opposite direction to the bracket 120. The contact device 200 may be disposed on a contact area of the PCB 110. The contact area may be an area engraved on a part of the surface of the PCB 110. Furthermore, a grounding terminal related to a grounding function of the PCB 110 or an antenna connection terminal related to an antenna function may be provided to the contact area. The contact device 200, which supports the surface of the PCB 110 and electrically contacts the bracket 120, may have a height that may range from about 0.15 mm to about 0.7 mm or 1 mm.

Figure 3:
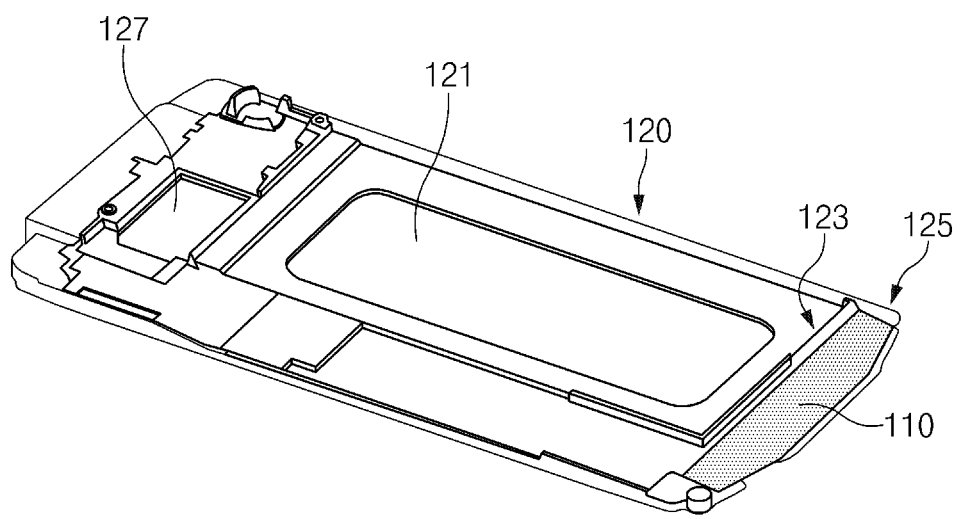
FIG. 3 is a perspective view of a bracket and a printed circuit board (PCB) according to an embodiment of the present disclosure.

FIG. 3 is a diagram schematically illustrating shapes of a bracket and a PCB according to an embodiment of the present disclosure.

Referring to FIG. 3, the bracket 120 may have a rectangular shape so that a certain axis of the bracket 120 is longer than another axis thereof, that is the bracket 120 may have a length that is longer than its width. According to various embodiments of the present disclosure, the shape of the bracket 120 may be changed according to a design modification of the electronic device 100 or a designer's intention. The bracket 120 may include, for example, a camera hole 127, a battery placing part 121, a battery guide 123, and a PCB placing part 125. As described above, at least a part of the bracket 120 may be formed of a metal material. According to an embodiment of the present disclosure, in the bracket 120, the PCB placing part 125, the battery guide 123, and the battery placing part 121 may be formed of a metal material. The metallic bracket 120 may serve as a ground of the PCB 110.

The PCB 110 may be disposed on a lower end of the bracket 120, for example, the PCB placing part 125 adjacent to the battery guide 123. Elements for operating the electronic device 100 may be arranged on the PCB 110. At least a part of the front and rear surfaces of the PCB 110 may have an insulating layer so as not to be electrically connected to the bracket 120. A part of the insulating layer may be removed from at least one open part provided to one side of the PCB 110 so that metal lines formed on the PCB 110 may be exposed. Accordingly, the PCB 110 may be connected to the bracket 120 via the open part of the PCB 110 and the contact structure that is disposed on the open part.

Figure 4A:
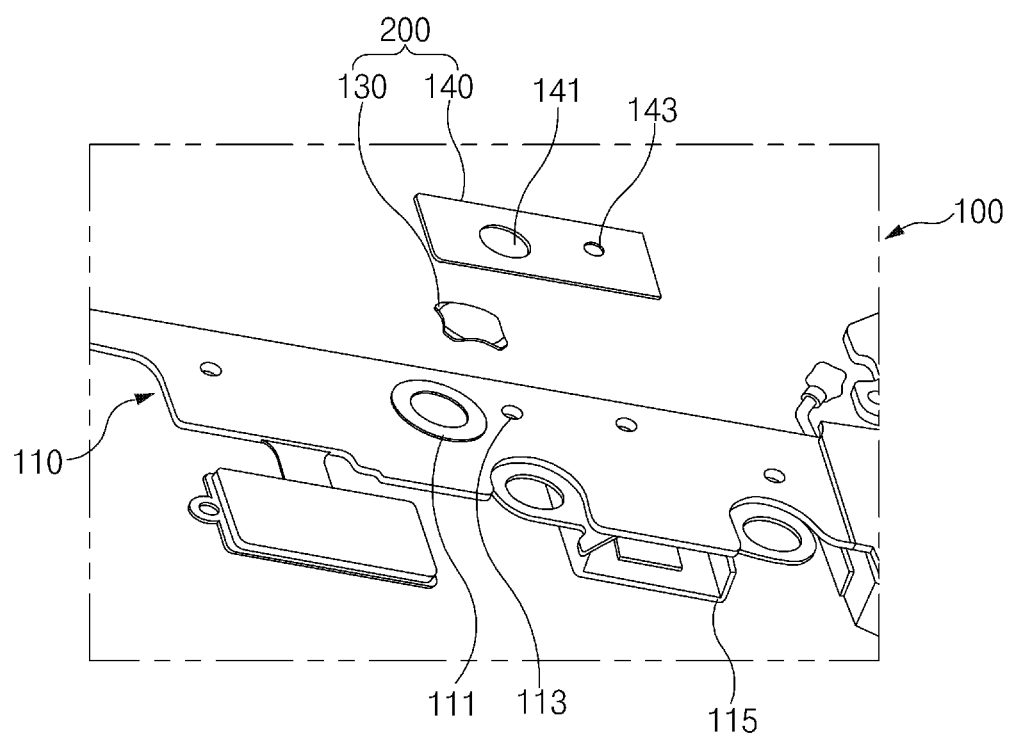
FIG. 4A is an exploded perspective view illustrating a PCB and a contact device according to an embodiment of the present disclosure.

FIG. 4A is an exploded perspective view illustrating a PCB and a contact device according to an embodiment of the present disclosure.

Referring to FIG. 4A, according to an embodiment of the present disclosure, the contact device 200 may include a contact structure 130 and a fixing part 140. The contact structure 130 may include a central body, which may be convex upward and at least one lead may extend outward from an edge of the central body with certain length and width. The central body may have a plate shape (or a disk shape) so that a center part of the central body is higher than a peripheral part thereof and the central body is curved from the peripheral part to the center part with a certain curvature. FIG. 4A exemplarily illustrates four leads of the contact structure 130. The fixing part 140 may surround an edge of the contact structure 130, and an adhesive material may be applied to one side of the fixing part 140 or an adhesive layer may be provided thereto. The fixing part 140 may serve to fix the contact structure 130 to a certain area of the PCB 110, for example, an area of an open part 111. In relation to this configuration, the fixing part 140 may include a sheet which may form a certain surface and a contact exposure area 141 provided so that at least a part of the contact structure 130 is exposed. According to various embodiments of the present disclosure, the fixing part 140 may include a joining hole 143 that corresponds to a board joining hole 113 provided to the PCB 110. The contact exposure area 141 formed in the fixing part 140 may have a smaller size than that of one surface of the contact structure 130 so as to surround an edge of the contact structure 130. According to various embodiments of the present disclosure, the fixing part 140 and the contact structure 130 may be provided as an assembly.

According to various embodiments of the present disclosure, the PCB 110 may include various areas, for example, an area where a connector 115 is connected, an area where an FPCB or the like for operating the electronic device 100 is disposed, and an area where a microphone or the like is disposed. According to an embodiment of the present disclosure, the open part 111 may be disposed at one side of the PCB 110.

According to various embodiments of the present disclosure, the open part 111 may be formed by removing a part of an insulating layer of the PCB 110 (or a surface thereof to a certain depth). As the insulating layer is removed, a contact area disposed under the insulating layer may be exposed to the outside. The open part 111 may expose an electrically conductive material. Although FIG. 4A illustrates the open part 111 as having a ring shape, various embodiments of the present disclosure are not limited thereto. For example, the open part 111 may be formed to correspond to the shape of the contact structure 130. According to an embodiment of the present disclosure, the open part 111 may be formed in the shape of a rectangular band. According to various embodiments of the present disclosure, in the case where the contact structure 130 has a circular or elliptical central body and three leads, the open part 111 may be formed in the shape of a triangular band. According to various embodiments of the present disclosure, the open part 111 may be formed in the shape of a dot or a hole (formed as an insulating layer of a partial area is removed) other than a band. As the insulating layer (or surface) is removed, the open part 111 may have an engraved form.

Figure 4B:
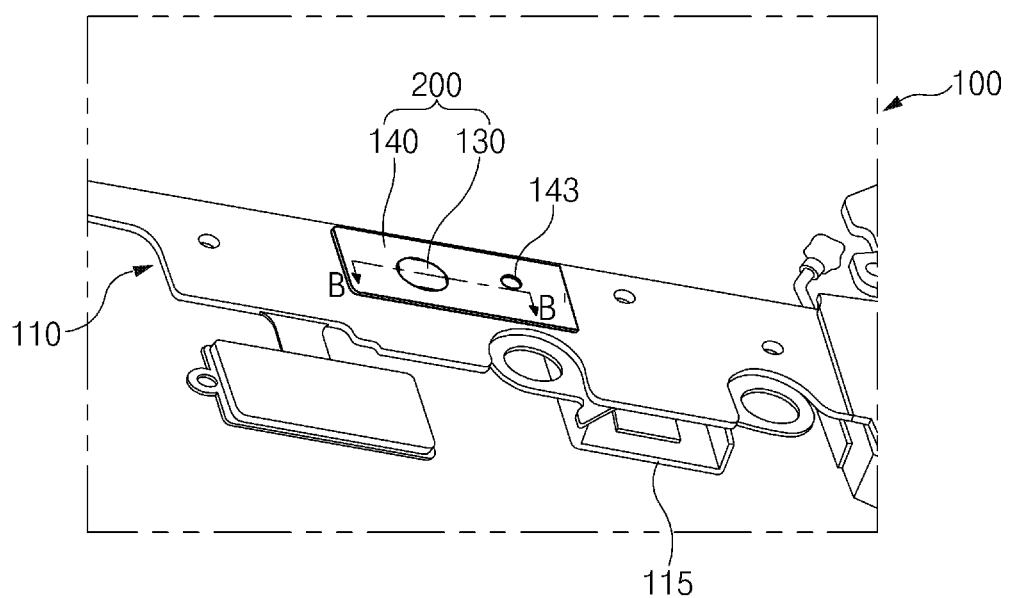
FIG. 4B is a diagram illustrating a PCB joined to a contact device according to an embodiment of the present disclosure.

FIG. 4B is a diagram illustrating that a PCB is joined to a contact device according to an embodiment of the present disclosure.

Referring to FIG. 4B, the contact structure 130 may be aligned on the open part 111 provided on one side of the PCB 110, and the fixing part 140 may be attached so as to cover the contact structure 130 and one side of the PCB 110. Here, as a center of the contact exposure area 141 of the fixing part 140 is aligned with a center of the contact structure 130, at least a part of the contact structure 130 may be exposed to the outside through the contact exposure area 141. According to an embodiment of the present disclosure, an entire size of the contact exposure area 141 may be smaller than that of the contact structure 130 such that a part of the contact structure 130 (e.g., the central body of the contact structure 130) may be exposed. According to various embodiments of the present disclosure, the joining hole 143 of the fixing part 140 may be attached to the PCB 110 so as to be aligned with the board joining hole 113 of the PCB 110. The fixing part 140 may be formed of a nonconductive material.

Figure 4C:
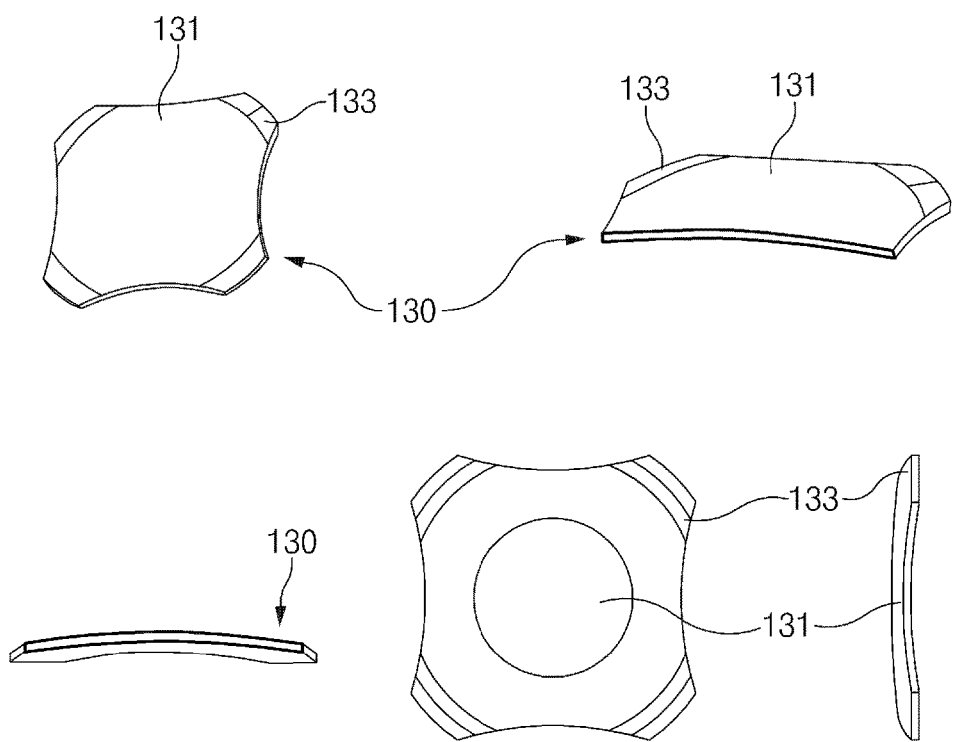
FIG. 4C is a diagram illustrating a shape of a contact structure according to an embodiment of the present disclosure in several orientations.

FIG. 4C is a diagram illustrating a shape of a contact structure according to an embodiment of the present disclosure.

Referring to FIG. 4C, as described above, the contact structure 130 may include a central body 131 protruding to a certain height from a horizontal plane and at least one lead 133 extending outwards from an edge of the central body 131. The at least one lead 133 may be integrated with the central body 131 so that the at least one lead 133 extends from the central body 131.

The central body 131 may have a disk shape or a polygonal shape such that the center part of the central body 131 protrudes over the peripheral part thereof. FIG. 4C exemplarily illustrates that the central body 131 generally has a polygonal shape obtained by cutting certain parts (e.g., parts of an edge of a disk) of a disk-shaped body at regular intervals. According to an embodiment of the present disclosure, the central body 131 may include edge areas, which may protrude further than the adjacent edge areas, and less protruding edge areas which may connect ends of the further protruding edge areas in a circular shape. The less protruding edge areas may be curved towards the center part as illustrated in FIG. 4C. A curvature of this curved shape may range from R2 to R4, for example, R3.7. According to an embodiment of the present disclosure, the edge of the central body 131 may have recessed parts. Distances between the recessed parts and depths thereof may be different from each other. According to an embodiment of the present disclosure, the central body 131 may have a plurality of areas, which may protrude further outwards than adjacent peripheral parts. According to an embodiment of the present disclosure, the central body 131 may be shaped like a dome. The central body 131 may be bent or pressed by a pressure applied vertically downwards from the outside. While being bent or pressed, the central body 131 may accumulate a certain amount of a restoring force. According to an embodiment of the present disclosure, a height from the horizontal plane to the center point of the central body 131 may be 0.1-0.7 mm (e.g., 0.25 mm).

According to various embodiments of the present disclosure, at least one lead 133 may be disposed at the edge of the central body 131. According to an embodiment of the present disclosure, the at least one lead 133 may be disposed at an area of the central body 131 that may protrude over adjacent areas. Although FIG. 4C exemplarily illustrates four leads 133, various embodiments of the present disclosure are not limited thereto. For example, the number of the leads 133 may be two or more according to a design modification. Furthermore, shapes of the leads 133 may also be changed according to the number of the leads 133. The leads 133 may be tapered in an outward direction and the ends of the leads 133 may be rounded. Curvatures of the ends of the leads 133 may range from R1.0 to R3.0, and may be, for example, R2.0. According to an embodiment of the present disclosure, the leads 133 may be curved with certain curvatures in an upward direction with respect to the horizontal plane. Although FIG. 4C illustrates that the four leads 133 have substantially similar shapes, the four leads 133 may have different shapes in various embodiments of the present disclosure.

According to various embodiments of the present disclosure, the conductive pattern may include at least one of the grounding terminal or the antenna connection terminal of the PCB.

According to various embodiments of the present disclosure, the electronic device may further include a bracket, which may be electrically in contact with the contact structure as the PCB is fixed.

According to various embodiments of the present disclosure, a contact structure for an electric connection of a mobile electronic device having a printed circuit board (PCB) is provided. The contact structure comprises a plate-type central body having a center part which is raised higher than a peripheral part, the central body curved with a certain curvature from the peripheral part to the center part and at least one lead extending outwards from an edge of the central body, wherein the lead is disposed so as to electrically contact a conductive pattern formed on the PCB.

According to various embodiments of the present disclosure, the leads are arranged at edge areas of the central body so as to be symmetrical with each other with respect to a center of the central body.

According to various embodiments of the present disclosure, the contact structure further comprises a protrusion protruding upwards from a center of the central body.

According to various embodiments of the present disclosure, the central body comprises edge areas, which may protrude further outwards than adjacent edge areas and less protruding edge areas which connect ends of the further protruding edge areas in a circular shape.

According to various embodiments of the present disclosure, a contact device for an electric connection of a mobile electronic device having a printed circuit board (PCB) is provided. The contact device may include a contact structure comprising a plate-type central body having a center part which is raised higher than a peripheral part, the central body curved with a certain curvature from the peripheral part to the center part, and at least one lead extending outwards from an edge of the central body and a fixing part which exposes at least a part of the central body while surrounding the lead or the lead and at least a part of the edge of the central body. An adhesive layer may be disposed on a surface of the fixing part which surrounds the lead or the lead and at least a part of the edge of the central body.

According to various embodiments of the present disclosure, the contact device further comprises a protective layer facing the adhesive layer of the fixing part.

According to various embodiments of the present disclosure, the lead is disposed so as to electrically contact a conductive pattern formed on the PCB.

According to various embodiments of the present disclosure, the contact device further comprises a protrusion protruding upwards from a center of the central body.

According to various embodiments of the present disclosure, a mobile electronic device that may include a contact device comprising a contact structure comprising a plate-type central body having a center part which is raised higher than a peripheral part, the central body curved with a certain curvature from the peripheral part to the center part, and at least one lead extending outwards from an edge of the central body, and a fixing part which exposes at least a part of the central body while surrounding the lead or the lead and at least a part of the edge of the central body. An adhesive layer may be disposed on a surface of the fixing part which surrounds the lead or the lead and at least a part of the edge of the central body and a printed circuit board (PCB) to which the fixing part is bonded and which electrically contacts the contact structure.

According to various embodiments of the present disclosure, the PCB comprises a conductive pattern which may be electrically in contact with the contact structure.

According to various embodiments of the present disclosure, the conductive pattern may include at least one of a grounding terminal and an antenna connection terminal of the PCB.

According to various embodiments of the present disclosure, the mobile electronic device further comprises at least one of a bracket to which the PCB may be fixed and which may electrically contact the contact structure or a protrusion protruding upwards from a center of the central body.

Figure 5A:
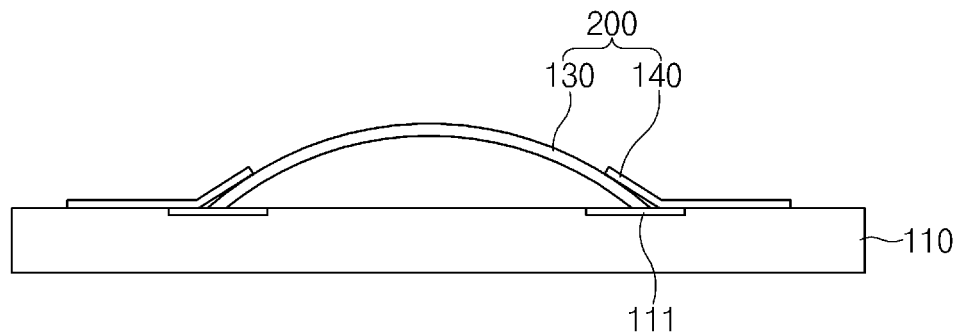
FIG. 5A is a diagram illustrating a cross section of a PCB to which a contact device is attached, taken along line B-B' of FIG. 4B.

FIG. 5A is a diagram illustrating a cross section of a PCB to which a contact device is attached, taken along line B-B'.

Referring to FIG. 5A, at least a part of the electronic device 100 may include the PCB 110 and the contact device 200 disposed on the PCB 110. The contact device 200 may include the dome-type contact structure 130 and the fixing part 140 surrounding the edge of the contact structure 130.

According to various embodiments of the present disclosure, the PCB 110 may have a certain thickness, and the open part 111 may be disposed at one side of the PCB 110. The open part 111 may be used as a contact area. In relation to this configuration, the grounding terminal of the PCB 110 or the antenna connection terminal thereof may be disposed on the open part 111. An end of the contact structure 130 may be disposed on the open part 111 may electrically contact the grounding terminal or the antenna connection terminal disposed on the open part 111.

According to various embodiments of the present disclosure, the end (e.g., the lead 133) of the contact structure 130 may be disposed on the open part 111. According to various embodiments of the present disclosure, the contact exposure area 141 of the fixing part 140 may be disposed so that the contact structure 130 may be exposed except for the end (e.g., the lead 133) of the contact structure 130. Alternatively, the contact exposure area 141 of the fixing part 140 may be disposed so that the contact structure 130 may be exposed except for the end of the contact structure 130 and a partial area of the edge of the central body. In the above-mentioned state, the fixing part 140 may prevent the contact structure 130 from floating. Furthermore, the fixing part 140 may serve to support the contact structure 130 while the contact structure 130 may be deformed by a pressure applied thereto vertically downwards (e.g., a pressure applied due to a contact with the bracket 120).

Figure 5B:
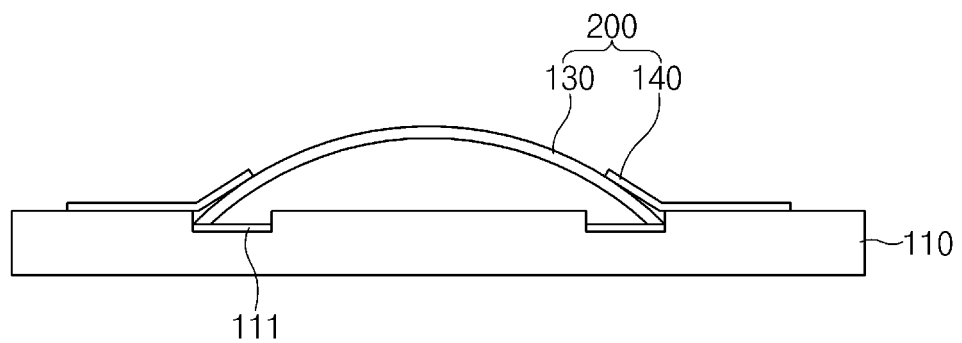
FIG. 5B is a diagram illustrating another cross section of a PCB to which a contact device is attached, taken along line B-B' of FIG. 4B.

FIG. 5B is a diagram illustrating another cross section of a PCB to which a contact device is attached, taken along line B-B'.

Referring to FIG. 5B, a part of the electronic device may include, for example, the PCB 110 and the contact device 200. The contact device 200 may have a configuration which may be the same as or substantially similar to that described above with reference to FIG. 5A.

According to various embodiments of the present disclosure, the PCB 110 may have a certain thickness, and the open part 111 may be disposed at one side of the PCB 110. The open part 111, for example, may be an area where at least a part of the grounding terminal or the antenna connection terminal of the PCB 110 is disposed. The open part 111, for example, may be engraved in a certain area of the PCB 110. Accordingly, the open part 111 may have a step with a height that is lower than that of the adjacent PCB 110. A sidewall of the step of the open part 111 may serve to support an end of the contact structure 130 while the contact structure 130 is disposed on the open part 111.

Figure 6:
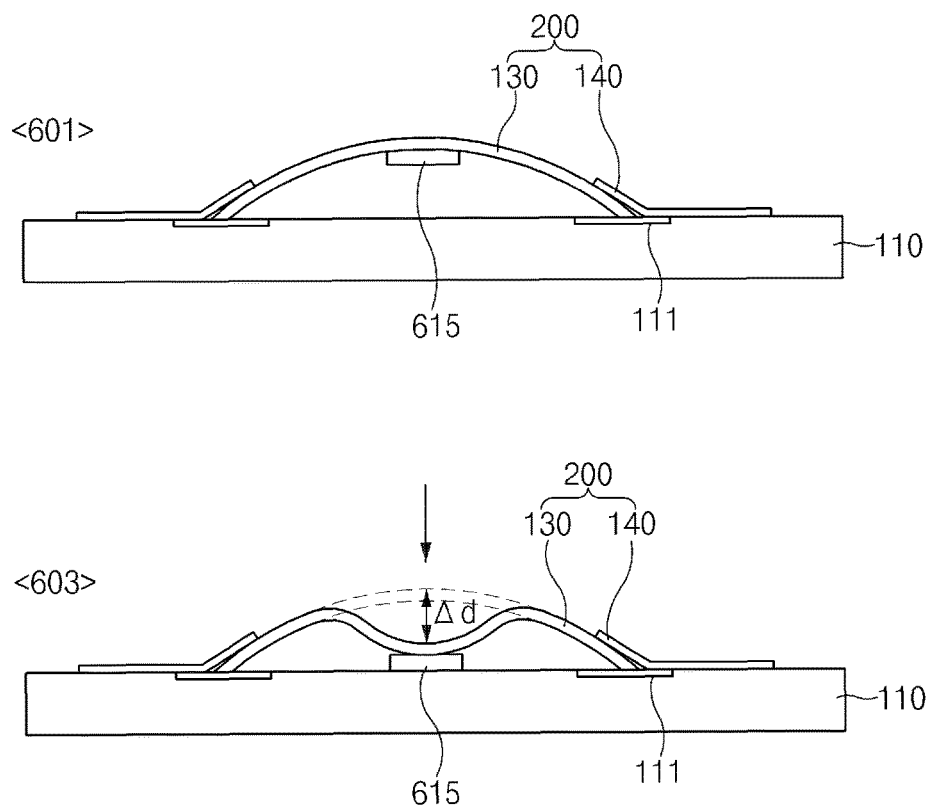
FIG. 6 is a diagram illustrating shapes of a PCB and a contact device before and after being pressed according to an embodiment of the present disclosure.

FIG. 6 is a diagram illustrating shapes of a PCB and a contact device according to an embodiment of the present disclosure.

Referring to FIG. 6, at least a part of the electronic device 100 may include the PCB 110 and the contact device 200. The open part 111 may be provided to the PCB 110 so that the grounding terminal or the antenna connection terminal may be exposed. The dome-type contact structure 130 may be disposed on the open part 111. The fixing part 140 may be disposed so that the contact structure 130 does not float on the open part 111 as a part of the dome-type contact structure 130 may be exposed.

According to an embodiment of the present disclosure, as shown in a state 601, the contact device 200 may further include a support member 615. The support member 615, for example, may be disposed at a certain portion of the contact structure 130. According to an embodiment of the present disclosure, the support member 615 may be disposed at a dome center part of the contact structure 130, having certain thickness and area. The support member 615, for example, may be disposed inside the contact structure 130.

According to an embodiment of the present disclosure, as shown in a state 603, the support member 615 may support the contact structure 130 so that the contact structure 130 does not contact a surface of the PCB 110 while the contact structure 130 is bent vertically downwards. In the case where the dome-type contact structure 130 is made of a metal thin film, the contact structure 130 may be deformed when being pressed to more than a certain degree. Therefore, the support member 615 having a certain thickness supports the center part of the contact structure 130 so that a stable electric connection is achieved and deformation of the contact structure 130 may be prevented. In relation to this configuration, a height d (e.g., 0.15 mm or less) of the support member 615 may be smaller than a distance between the horizontal plane (e.g., the surface of the PCB 110) and the contact structure 130. The support member 615, for example, may be formed, for example, from the following: sponge, polyurethane, rubber, and/or the like. The support member 615, for example, may be formed of the same material as the contact structure 130. In order to attach the support member 615 to the inside of the center part of the contact structure 130, an adhesive material or an adhesive layer may be applied to or disposed on a surface of the support member 615 to which the contact structure 130 is to be attached.

Figure 7:
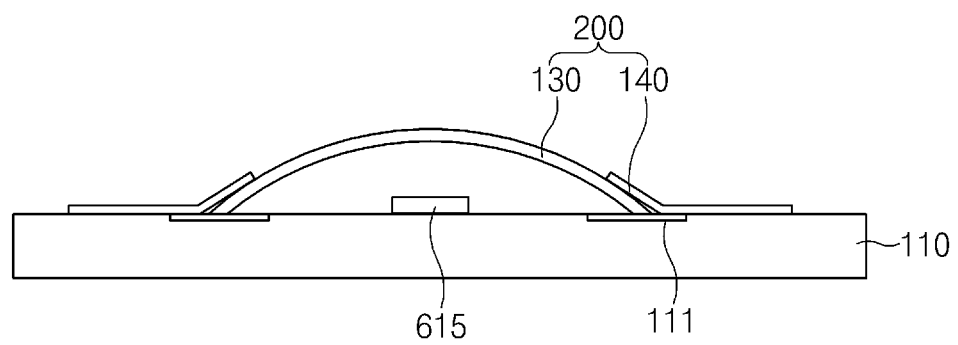
FIG. 7 is a diagram illustrating other shapes of a PCB and a contact device according to an embodiment of the present disclosure.

FIG. 7 is a diagram illustrating other shapes of a PCB and a contact device according to an embodiment of the present disclosure.

Referring to FIG. 7, a part of the electronic device 100 according to an embodiment of the present disclosure may include the PCB 110 and the contact device 200. The contact device 200 may be substantially the same as or similar to the contact device described above with reference to FIG. 5A or 5B.

According to various embodiments of the present disclosure, the open part 111 may be disposed at a certain portion of the PCB 110. The open part 111 may have, for example, a band shape. According to an embodiment of the present disclosure, the support member 615 may be disposed inside the open part 111. The support member 615 may serve to support the center part of the contact structure 130 while the contact structure 130 may be bent by an external pressure. The support member 615, for example, may be formed of the same material (e.g., wood, plastics, or the like) as the PCB 110. Alternatively, the PCB 110 may be formed of an elastic material such as, for example, a sponge or the like. In order to attach the support member 615 to the PCB 110, an adhesive material or an adhesive layer may be applied to or disposed on a surface of the support member 615 to which the PCB 110 is to be attached.

Figure 8:
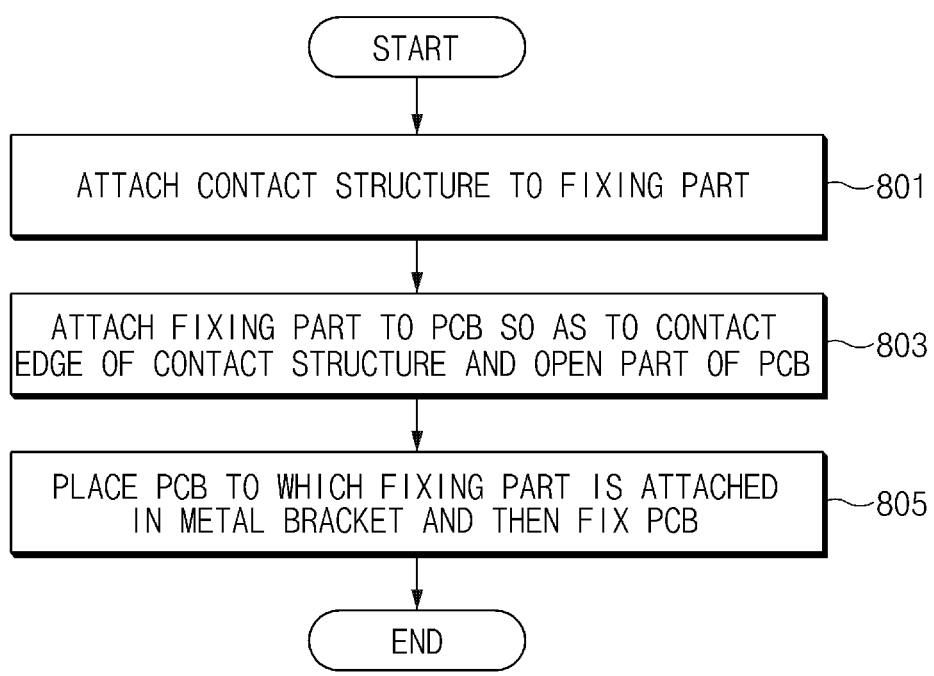
FIG. 8 is a flowchart illustrating a method for attaching a contact device according to an embodiment of the present disclosure.

FIG. 8 is a diagram illustrating a method for attaching a contact device according to an embodiment of the present disclosure.

Referring to FIG. 8, in step 801, the contact structure 130 may be attached to the fixing part 140. Here, the contact structure 130 may be aligned with the contact exposure area 141 of the fixing part 140 so as to be attached. The contact structure 130 may be disposed so that a partial area of the contact structure 130, including the center part thereof, may be exposed or protrude from a surface of the fixing part 140. A certain area of the contact structure 130 (e.g., the lead 133 of the contact structure 130 or the lead 133 and the edge of the central body) may contact a lower surface of the fixing part 140. An adhesive material or an adhesive layer may be applied to or disposed on the lower surface of the fixing part 140. Therefore, the contact structure 130 may be fixed to the contact exposure area 141 by the adhesive material or the adhesive layer provided to the lower surface of the fixing part 140. According to various embodiments of the present disclosure, the contact device 200 having the contact structure 130 and a protective layer may be provided. The contact structure 130 may be disposed so that the center part of the contact structure 130 protrudes through the contact exposure area 141 and the edge or the lead 133 of the contact structure 130 contacts a lower part of the fixing part 140, and the protective layer is disposed under the fixing part 140 so as to cover the adhesive layer of the fixing part 140. In this case, the protective layer may be removed from the fixing part 140 before the contact device 200 is attached to the PCB 110.

According to various embodiments of the present disclosure, in step 803, the contact device 200 may be aligned so that the edge of the contact structure 130 is aligned with the open part 111 of the PCB 110, and the fixing part 140 may be attached to a surface of the PCB 110. Therefore, the contact structure 130 may be electrically connected to the grounding terminal or the antenna connection terminal disposed at the open part 111. According to an embodiment of the present disclosure, in order to accurately align the fixing part 140 with the PCB 110, the PCB 110 may include an attachment position guide hole (e.g., the board joining hole 113).

According to various embodiments of the present disclosure, in step 805, the PCB 110 to which the fixing part 140 is attached is placed on the metallic bracket 120, and then the PCB 110 may be fixed. Accordingly, a certain area of the metallic bracket 120 may be electrically connected to the contact structure 130 when pressing the contact structure 130 vertically downwards. The metallic bracket 120 may include, for example, an antenna pattern. Accordingly, the certain area of the metal bracket 120 may be a specific area related to an antenna, such as a feeding part of the antenna pattern or a grounding part of the antenna pattern. According to various embodiments of the present disclosure, in step 805, the PCB 110 to which the fixing part 140 is attached may be aligned with an antenna carrier, and the antenna carrier may be fixed to the PCB 110. In this case, an antenna disposed in the antenna carrier may be electrically connected to the contact structure 130. The antenna carrier, for example, may be another structure (e.g., a rear cover or the like) in which the antenna pattern is disposed. According to various embodiments of the present disclosure, the contact structure 130 fixed to the PCB 110 by the fixing part 140 may electrically contact a heat dissipating plate for dissipating heat of a display. In order to securely fix the PCB 110 to the bracket 120, a hook joining part, an adhesive member such as a double-sided tape or bond, or a joining member such as a screw may be disposed between the PCB 110 and the bracket 120. At least a part of the bracket 120 may be formed of metal.

Figure 9:
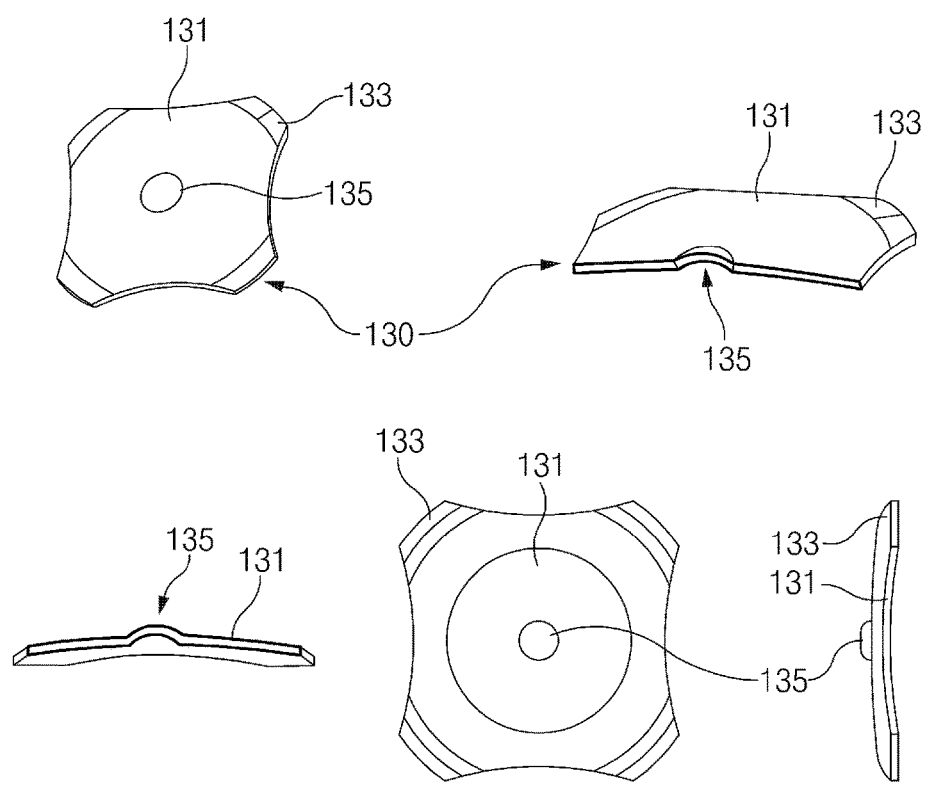
FIG. 9 illustrates another type of a contact structure according to an embodiment of the present disclosure shown in various orientations.

FIG. 9 illustrates another type of a contact structure according to an embodiment of the present disclosure.

Referring to FIG. 9, the contact structure 130 may include the central body 131, the lead 133, and a protrusion 135.

The central body 131, for example, may have a disk shape so that the center part of the central body 131 is raised to a certain height (e.g., 0.1-0.7 mm, particularly 0.25 mm) from the horizontal plane (or the surface of the PCB 110) when the contact structure 130 is placed on the horizontal plane. The central body 131 may be curved from the edge to the center part. The curvature of an inwardly curved area of the edge of the central body 131 may have a certain value between R2.0 and R4.5, for example, R3.7.

According to various embodiments of the present disclosure, at least one lead 133 may be disposed in a direction away from the edge of the central body 131. According to various embodiments of the present disclosure, the leads 133 may be arranged at edge areas of the central body 131 so as to be symmetrical with each other with respect to the center of the central body 131. The lead 133 may be such formed that a part of the lead 133, which may extend outwards, may have a smaller width than that of an edge area of the central body 131. For example, the width of the lead 133 may decrease in a direction away from the edge area of the central body 131 gradually or with a certain curvature to a specified width. Alternatively, the lead 133 may be formed so as to have the same width and thickness. An end of the lead 133 may be rounded and may have a curvature of, for example, R2.0.

According to various embodiments of the present disclosure, the protrusion 135 may protrude from a center point of the central body 131 upwards (e.g., in a direction away from the surface of the PCB 110) to a certain height. The protrusion 135, for example, may have a hemispherical shape or a hemi-elliptical sphere shape. Although FIG. 9 illustrates that the interior of the protrusion 135 is empty, various embodiments of the present disclosure are not limited thereto. For example, as described above with reference to FIG. 4C, the central body 131 may be shaped like a disk having a generally uniform curvature, and the protrusion 135 may be additionally formed on the center point of the central body 131.

According to various embodiments of the present disclosure, the contact structure 130 described above may be used for an antenna contact. The protrusion 135 may have a height of, for example, 0.05-0.2 mm (e.g., 0.1 mm). In the case where the protrusion 135 has the height of 0.1 mm, a vertical height from the end of the lead 133 of the contact structure 130 to the protrusion 135 disposed at the center point of the central body 131 may be 0.25 mm. Furthermore, in the case where a fixed-type conductive tape having a thickness of 0.05 mm is used, the total height may be 0.3 mm. The contact structure 130 described above may have an appropriate elastic force and may provide an electrical contact to the bracket 120 even if it is very thin.

Figure 10A:
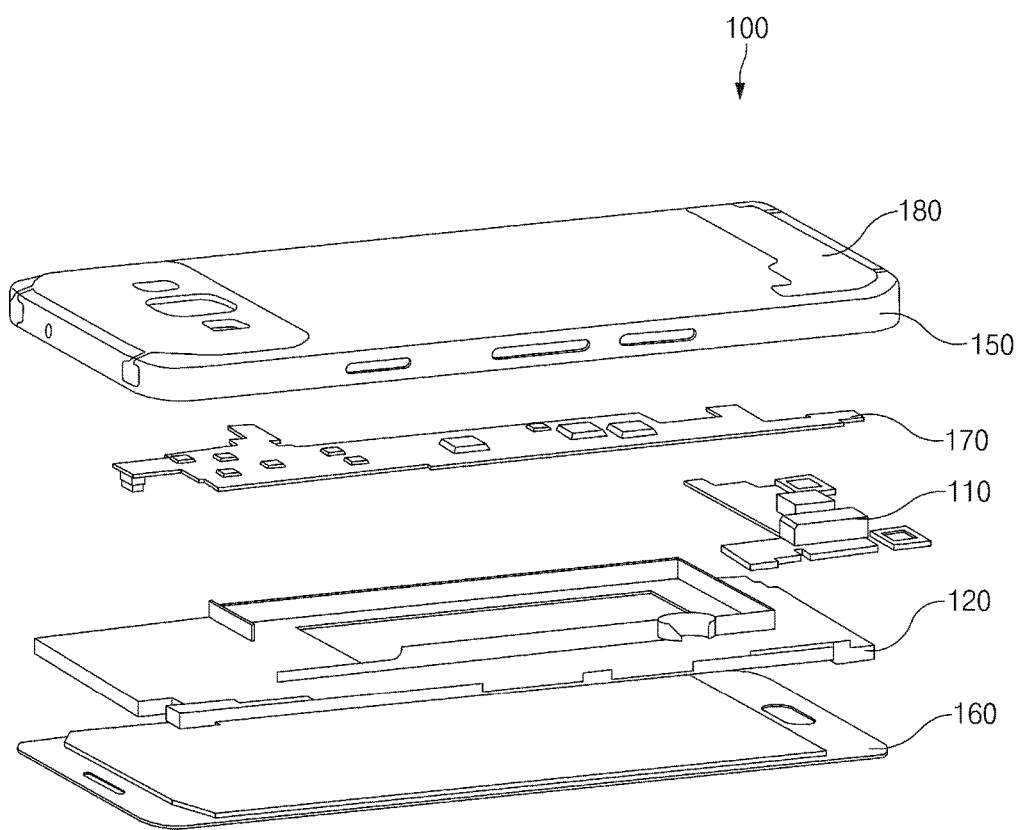
FIG. 10A is an exploded perspective view of an electronic device according to an embodiment.

FIG. 10A is a diagram schematically illustrating an electronic device according to an embodiment.

Referring to FIG. 10A, the electronic device 100 may include a display 160, the bracket 120, the PCB 110, a main PCB 170, and a rear cover 150. At least a part of the rear cover 150 may include the bracket 120. The display 160 may output a screen according to operation of the electronic device 100. The display 160 may be disposed on one side of the bracket 120. The main PCB 170 and the PCB 110 (or a sub PCB) may be arranged on the opposite side to the one side on which the display 160 is disposed. As described above, at least a part of the bracket 120 may be formed of a metal material. For example, at least a part of the bracket 120, which faces the PCB 110, may be formed of a metal material such that the PCB 110 may use the bracket 120 as a grounding area.

According to various embodiments of the present disclosure, the main PCB 170 may be disposed on a certain surface of the bracket 120. The main PCB 170 may include at least one communication module. The communication module disposed on the main PCB 170 may transmit/receive signals using an antenna. In relation to this operation, at least one antenna may be disposed on the rear cover 150. According to an embodiment of the present disclosure, an antenna 180 may be disposed on a lower area of the rear cover 150. The antenna 180 may face at least a part of the main PCB inside the rear cover 150. The rear cover 150 may be provided with an opening at a first surface (e.g., an edge part surrounding the display 160) oriented in a first direction, and may include side walls arranged at an edge of a second surface (e.g., a bottom surface on which the PCB, display, and bracket may be placed opposite to the first direction.

According to various embodiments of the present disclosure, the electronic device 100 may include at least one contact device for electrically contacting the PCB 110 to the bracket 120, and at least one contact device for electrically contacting the main PCB 170 to the antenna 180 disposed on the rear cover 150. According to various embodiments of the present disclosure, the main PCB 170 may include various electric contacts of the antenna 180 (e.g., at least one antenna ground, or at least one antenna feeding unit). In this case, a plurality of contact devices may be arranged so that the main PCB 170 electrically contacts the antenna 180.

Figure 10B:
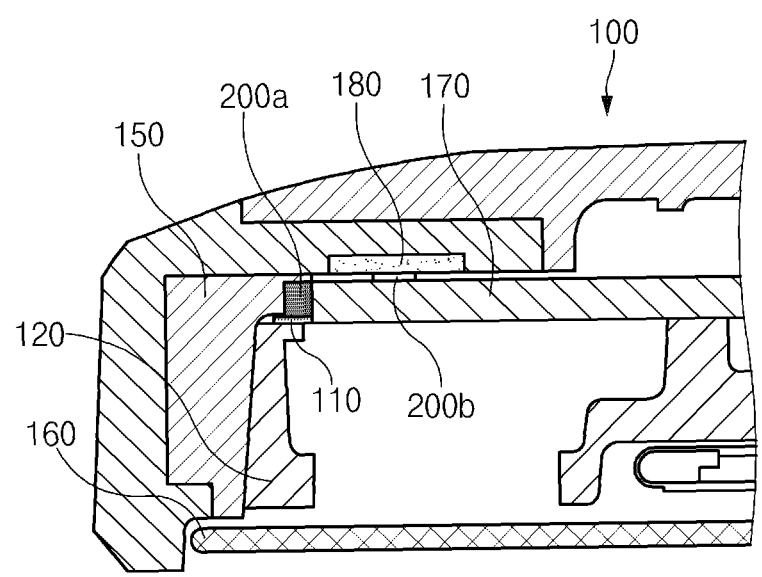
FIG. 10B is a cross-sectional view of a part of an electronic device according to an embodiment of the present disclosure.

FIG. 10B is a diagram illustrating a cross section of a part of an electronic device according to an embodiment of the present disclosure.

Referring to FIG. 10B, in the electronic device 100, the display 160 may be disposed so that at least a part of a front surface of the display 160 is exposed to the outside. From the cross sectional view of FIG. 10B, a partial area of the rear cover 150 may surround an edge of the display 160. From the cross sectional view of FIG. 10B, the bracket 120 may be disposed inside the rear cover 150 and on the display 160, and the PCB 110 and the main PCB 170 may be arranged on the bracket 120. The main PCB 170 and the PCB 110 may be arranged at an inner bottom part of the rear cover 150.

According to various embodiments of the present disclosure, a first contact device 200a may be disposed between the PCB 110 and the bracket 120. The first contact device 200a, for example, may include a contact structure that may electrically contact the bracket 120, and a fixing part which attaches and fixes the contact structure to the PCB 110. The contact structure of the first contact device 200a, for example, may not have the protrusion described above with reference to FIG. 9. According to various embodiments of the present disclosure, a contact structure having the protrusion described above with reference to FIG. 9 may be included in the first contact device 200a. The contact structure of the first contact device 200a may be connected to a conductive pattern of the PCB 110 (e.g., the grounding terminal of the PCB 110), and then may contact the bracket 120. Accordingly, the PCB 110 may be grounded via the bracket 120.

According to various embodiments of the present disclosure, as shown in FIG. 10B, a second contact device 200b may be disposed between the main PCB 170 and the rear cover 150. The second contact device 200b may be substantially disposed between the main PCB 170 and the antenna 180. The second contact device 200b may electrically contact a conductive pattern (e.g., a metal pattern which is electrically connected to a communication module and is exposed to the outside from the surface of the main PCB 170) of an open part formed in the main PCB 170. A contact structure included in the second contact device 200b may electrically contact the conductive pattern. The other side (e.g., an area where a protrusion is disposed) of the contact structure of the second contact device 200b may electrically contact the antenna 180 disposed on the rear cover 150.

Various embodiments of the present disclosure may provide a mounting structure which may provide an electrically stable contact and is mechanically slim using a dome-type contact structure.

Furthermore, according to various embodiments of the present disclosure, a contact structure may be applied regardless of a thickness of a PCB, and cutting of the PCB is not required, thereby improving utilization of space.

According to various embodiments of the present disclosure, an electronic device is provided. The electronic device comprises a housing comprising a first surface opened in a first direction or oriented in the first direction and a second surface oriented in a second direction opposite to the first direction, a first conductive member which forms at least a part of the first surface or is disposed in the housing, a second conductive member spaced apart substantially in the second direction from the first conductive member and a conductive dome structure disposed between at least a part of the first conductive member and at least a part of the second conductive member and forming an electric path between the first conductive member and the second conductive member.

According to various embodiments of the present disclosure, the conductive dome structure has a hemispherical shape which is substantially hollow.

According to various embodiments of the present disclosure, the conductive dome structure has a substantial circular or polygonal shape when seen from the first surface or the second surface, and has a substantial semicircular shape when seen in a vertical direction to the first direction.

According to various embodiments of the present disclosure, at least a part of the conductive dome structure may comprise a flexible material so that the semicircular shape is deformed in the first direction or the second direction when the conductive dome structure is pressed by the first conductive member and/or the second conductive member in the first direction or the second direction.

According to various embodiments of the present disclosure, the electronic device may further comprise a printed circuit board (PCB), wherein the second conductive member is disposed on at least a part of the PCB.

According to various embodiments of the present disclosure, the electronic device may further comprise another conductive dome structure disposed on the PCB.

According to various embodiments of the present disclosure, the electronic device may further comprise at least one adhesive member extending on at least a part of the conductive dome structure and at least a part of the second conductive member.

According to various embodiments of the present disclosure, the electronic device may further comprise a support member disposed on the second conductive member, wherein the support member contacts at least a part of the conductive dome structure.

The above embodiments of the present disclosure are illustrative and not limitative. Various alternatives and equivalents are possible. Other additions, subtractions, or modifications are obvious in view of the present disclosure and are intended to fall within the scope of the appended claims.

What is claimed is:

1. A contact structure for an electric connection of a mobile electronic device having a printed circuit board (PCB) having a conductive pattern formed on the PCB, the contact structure comprising:

a plate-type central body having a center part which is raised higher than a peripheral part, the central body curved with a certain curvature from the peripheral part to the center part; and at least one lead extending outwards from an edge of the central body, wherein the lead is disposed so as to electrically contact the conductive pattern formed on the PCB, wherein a fixing part exposes at least a part of the central body while surrounding the lead or the lead and at least a part of the edge of the central body, and wherein an adhesive layer is disposed on a surface of the fixing part, the adhesive part surrounding the lead or the lead and at least a part of the edge of the central body.

2. The contact structure of claim 1, wherein the leads are arranged at edge areas of the central body so as to be symmetrical with each other with respect to an axis extending through a center of the central body.

3. The contact structure of claim 1, further comprising a protrusion protruding upwards from a center of the central body.

4. The contact structure of claim 1, wherein the central body comprises:

first edge areas which further protrude outwards than adjacent edge areas; and second edge areas which protrude less than the first edge areas and connect ends of the further protruding edge areas in a circular shape.

5. A contact device for an electric connection of a mobile electronic device having a printed circuit board (PCB), the contact device comprising:

a contact structure having a plate-type central body including a center part which is raised higher than a peripheral part, the central body curved with a certain curvature from the peripheral part to the center part, and at least one lead extending outwards from an edge of the central body; and a fixing part which exposes at least a part of the central body while surrounding the lead or the lead and at least a part of the edge of the central body, wherein an adhesive layer is disposed on a surface of the fixing part, the adhesive part surrounding the lead or the lead and at least a part of the edge of the central body.

6. The contact device of claim 5, further comprising a protective layer facing the adhesive layer of the fixing part.

7. The contact device of claim 5, wherein the lead is disposed so as to electrically contact a conductive pattern formed on the PCB.

8. The contact device of claim 5, further comprising a protrusion protruding upwards from a center of the central body.

9. A mobile electronic device comprising:

a contact device having a contact structure including a plate-type central body having a center part;

a peripheral part, the center part being raised higher than a peripheral part, the central body curved with a certain curvature from the peripheral part to the center part;

at least one lead extending outwards from an edge of the central body;

a fixing part which exposes at least a part of the central body while surrounding at least one of the lead and at least a part of the edge of the central body, an adhesive layer being disposed on a surface of the fixing part, the adhesive layer surrounding at least one of the lead and at least a part of the edge of the central body; and a printed circuit board (PCB) to which the fixing part is bonded and which electrically contacts the contact structure.

10. The mobile electronic device of claim 9, wherein the PCB comprises a conductive pattern, the conductive pattern electrically contacts the contact structure.

11. The mobile electronic device of claim 10, wherein the conductive pattern comprises at least one of a grounding terminal and an antenna connection terminal of the PCB.

12. The mobile electronic device of claim 9, further comprising at least one of:

a bracket to which the PCB is fixed and which electrically contacts the contact structure; and a protrusion protruding upwards from a center of the central body.

* * * * *